United States Patent [19]

Okonogi et al.

[11] Patent Number: 5,374,582
[45] Date of Patent: Dec. 20, 1994

[54] LAMINATED SUBSTRATE FOR SEMICONDUCTOR DEVICE AND MANUFACTURING METHOD THEREOF

[75] Inventors: Kensuke Okonogi; Hiroaki Kikuchi, both of Tokyo, Japan

[73] Assignee: NEC Corporation, Tokyo, Japan

[21] Appl. No.: 233,940

[22] Filed: Apr. 28, 1994

[51] Int. Cl.$^5$ .................................. H01L 21/76
[52] U.S. Cl. .................................. 437/63; 437/974; 437/64; 437/67; 148/DIG. 12
[58] Field of Search .............. 437/63, 64, 974, 67; 148/DIG. 12

[56] References Cited

U.S. PATENT DOCUMENTS

| | | | |
|---|---|---|---|
| 4,532,003 | 7/1985 | Beasom | 437/974 |
| 4,638,552 | 1/1987 | Shimbo et al. | 148/DIG. 12 |
| 4,963,505 | 10/1990 | Fujii et al. | 148/DIG. 12 |
| 5,097,314 | 3/1992 | Nakagawa et al. | 437/62 |
| 5,100,814 | 3/1992 | Yamaguchi et al. | 437/974 |
| 5,234,535 | 8/1993 | Beyer et al. | 437/974 |

FOREIGN PATENT DOCUMENTS

| | | |
|---|---|---|
| 0287142 | 12/1986 | Japan .................. 437/974 |
| 142952 | 6/1991 | Japan . |

*Primary Examiner*—Brian E. Hearn
*Assistant Examiner*—Trung Dang
*Attorney, Agent, or Firm*—Sughrue, Mion, Zinn, Macpeak & Seas

[57] ABSTRACT

A method for fabricating a laminated substrate for a semiconductor device having a high voltage power device and a low voltage element formed in a region isolated from the power device with a P-N junction. The region for the low voltage element is formed on a buried layer of P type formed in the region of N type in which the power device is formed and surrounded by a isolating region of P type reaching the buried layer from the surface of the laminated substrate.

2 Claims, 3 Drawing Sheets

LAMINATED SUBSTRATE FOR SEMICONDUCTOR DEVICE AND MANUFACTURING METHOD THEREOF

BACKGROUND OF THE INVENTION

1. Field of the Invention

The present invention relates to a laminated substrate for semiconductor device and its manufacturing method, and more particularly to a composite substrate for a semiconductor device in which a power device and a control circuit for the power device are integrated, and its manufacturing method.

2. Description of the Prior Art

A composite dielectrically isolated substrate for monolithically integrates a power device having a current path from the front surface of a substrate to the rear surface and a device, for control circuit for the power device, having current path only on the front surface of the substrate, and its manufacturing method, are disclosed in Japanese Patent Laid Open No. H3-142952. The method for manufacturing a substrate disclosed in the above mentioned patent specification is described below by reference to FIGS. 1a to 1e.

First, as shown in FIG. 1a, a single crystal silicon substrate 10 is processed to have a thick portion 20 for forming a power device, a thin portion 21 for forming a control circuit device and an isolating groove being provided between them. Next, as shown in FIG. 1b, a silicon dioxide film 11 is formed on the entire surface of the rugged surface side of the substrate including the isolating groove. Then, as shown in FIG. 1c, a polycrystalline silicon layer 12 is deposited on the silicon dioxide film 11. In the next step, as shown in FIG. 1d, the substrate is polished until the single crystal portion 20 of the substrate 10, for forming a power device, is exposed, and mirror surface 22 is formed. Then, as shown in FIG. 1e, the mirror surface 22 of the substrate 10 and a mirror surface 25 of a single crystal silicon support substrate 13 are brought into contact with and bonded by heat treatment, and the silicon substrate 10 is polished from the side 23 until the silicon dioxide film 11 is exposed. Thus, a composite dielectrically isolated substrate having a device formation surface 24 is obtained. It is possible to form a power device having a current path from an electrode formed on the surface 24 of the portion 20 to a rear surface electrode formed on rear surface 26 of the support substrate 13, and it is possible to isolate by the silicon dioxide film 11 the power device from the control circuit device formed on the surface 24 of the portion 21.

In this conventional technology for composite dielectrically isolated substrate, it is necessary to polish three phases (single crystal silicon, silicon dioxide and polycrystalline silicon) into mirror surfaces on the same plane in order to obtain a bonding surface, but silicon dioxide has a higher hardness compared with single crystal silicon and polycrystalline silicon and it is difficult to uniformly polish them.

Moreover, the polishing process and the bonding process are carried out in a condition in which the silicon dioxide film and the poly crystalline silicon film are embedded in the single crystal silicon substrate. Therefore, a warp of the substrate becomes large in the polishing process and the bonding process which led to the generation of such problems as distortion and dislocation of single crystal of the element region.

BRIEF SUMMARY OF THE INVENTION

It is an object of the present invention to provide a laminated substrate which resolves the above mentioned problems.

The laminated substrate of the present invention comprises a first semiconductor substrate of first conductivity type having a first and a second main surfaces and a second semiconductor substrate having a third and a fourth main surfaces. The first main surface of the first semiconductor substrate is bonded to the third main surface of the second semiconductor substrate. A buried layer of second conductivity type is formed selectively in the first semiconductor substrate. An isolating region of the second conductivity type is formed to reach the buried layer from the second main surface of the first semiconductor substrate to form a region of the first conductivity type on the first region surrounded by the isolating region.

It is another object of the present invention to provide a method for manufacturing the laminated substrate.

The method comprises the steps of preparing a first semiconductor substrate of a first conductivity type and a second semiconductor substrate of the first conductivity type, forming a first region of a second conductivity type by selectively introducing impurities into one surface of the first semiconductor substrate, forming an epitaxial layer of the first conductivity type on one surface of the second semiconductor substrate, placing said one surface of the first semiconductor substrate and the face of the epitaxial layer in contact with each other and then heating the semiconductor substrates to bond each other, polishing the other surface of the first semiconductor substrate until a predetermined thickness thereof remains, and forming an isolating region of the second conductivity type reaching the buried layer from the polished surface of the first semiconductor substrate polished in the polishing step to form a region of the first conductivity type on the buried layer surrounded by the isolating region.

BRIEF DESCRIPTION OF THE DRAWINGS

The above and further objects, features and advantages of the present invention will become more apparent from the following detailed description of the embodiments taken in conjunction with the accompanying drawings, wherein.

DETAILED DESCRIPTION OF THE PREFERRED EMBODIMENTS

Figure 1A:
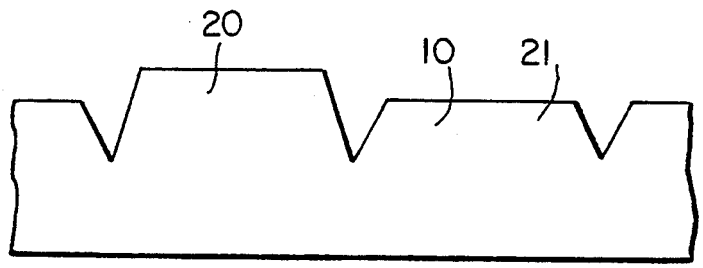
FIGS. 1a to 1e are sectional views illustrating in sequence the method for manufacturing a laminated substrate in the prior art.
Figure 1B:
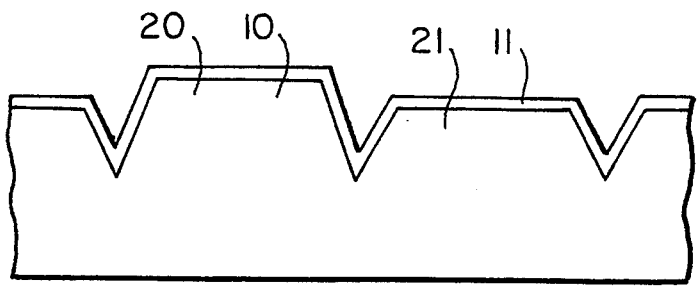
Figure 1C:
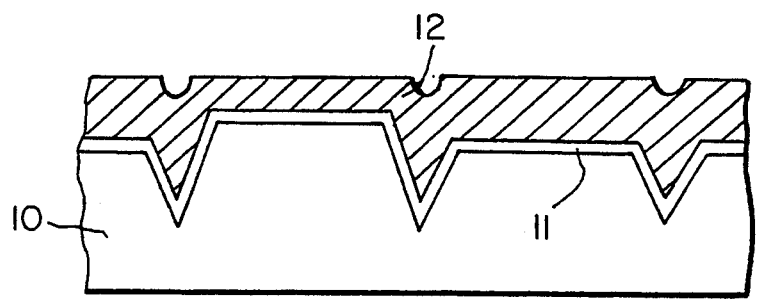
Figure 1D:
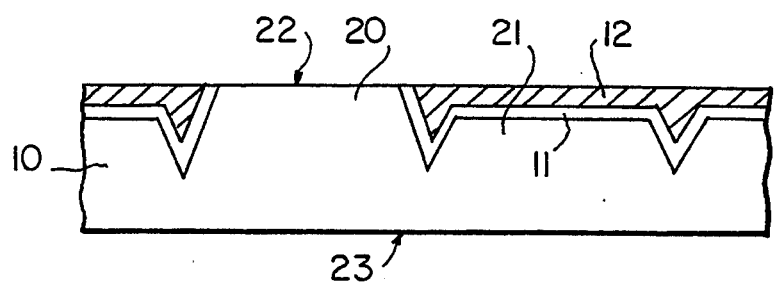
Figure 1E:
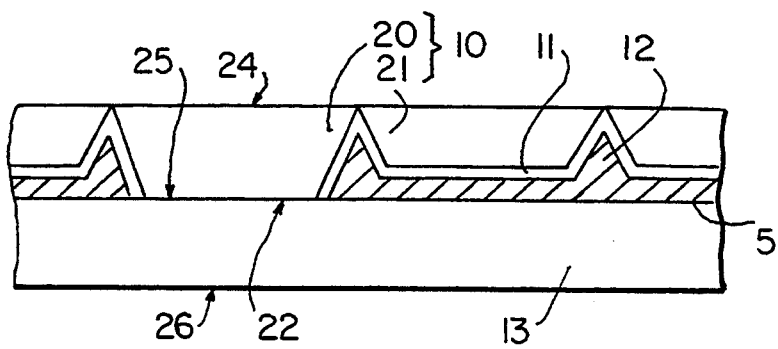

Referring to the drawings, the present invention will be described in detail as follows.

FIGS. 2a to 2e are sectional views illustrating in sequence a method for fabricating a substrate of the present invention.

Figure 2A:
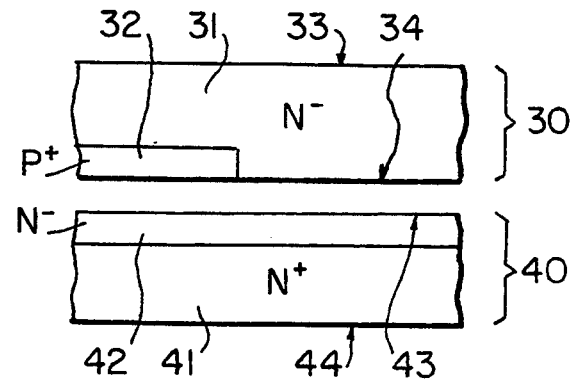
FIGS. 2a to 2d are sectional views illustrating in sequence a method for fabricating a substrate of the present invention.

First, as shown in FIG. 2a, a first silicon substrate 30 and a second silicon substrate 40 are provided. The first silicon substrate is provided by selectively forming a P+ type region 32 having a resistivity of about 0.001 to 0.020 Ω·cm by introducing to high concentration a P type impurity such as boron by means of ion implantation or thermal diffusion from the surface 34 of an N− type silicon substrate 31 having a resistivity of about 20 to 80 Ω·cm. The second silicon substrate 40 is provided by forming an N− type epitaxial layer 42 having a resistivity of about 20 to 80 Ω·cm and a thickness of about 20 to 50 μm on the entire surface of an N+ type silicon substrate 41 having a resistivity in the range of 0.001 to 0.020 Ω·cm.

Figure 2B:
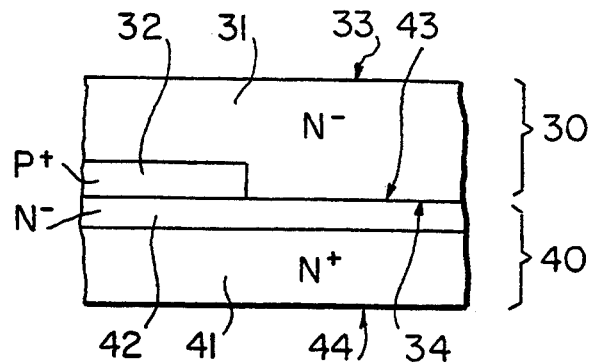

Next, as shown in FIG. 2b, the surface 43 of the epitaxial layer of the second silicon substrate 40 and one mirror polished surface 34 of the first silicon substrate 30 with the P+ type region 32 formed therein are brought into contact with each other. Then, heat treatment for about two hours at about 1100° C. is carried out to form a composite substrate of the first and second substrates. This process step is well known as wafer direct bonding technique.

Figure 2C:
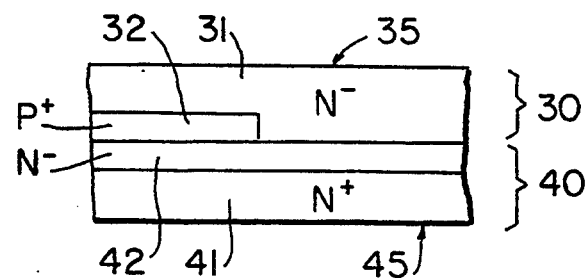

Then, as shown in FIG. 2c, surfaces of the composite substrate are polished both from the exposed surface 44 side and the surface 33 side to predetermined thickness, respectively, and mirror polished surfaces 45 and 35 are formed.

Figure 2D:
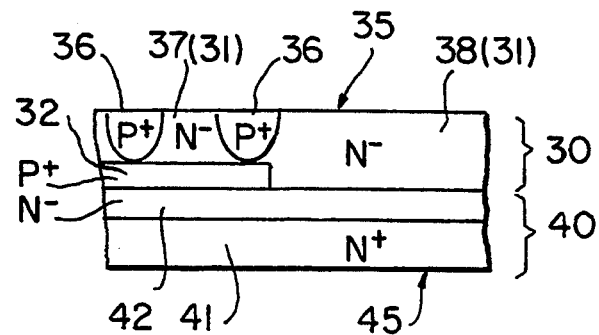

Next, as shown in FIG. 2d, a P+ type isolating region 36 having a resistivity in the range of 0.001 to 0.020 Ω·cm reaching the P+ type region 32 is formed by introducing a P type impurity such as boron to high concentration by ion implantation or thermal diffusion from the surface 35, thereby the N− type portion 37 surrounded by the isolating region 36 on the P+ type region 32 and the remaining N− type portion 38 of silicon substrate 31 are electrically isolated by P-N junction.

The N− type portion 38 becomes, together with the N− type epitaxial layer 42 and the N+ type portion 41 of the silicon substrate 40, a first element formation region in which can be formed a high voltage power element having a current path from an electrode on the surface 35 to an electrode on the surface 45, while the N− type portion 37 surrounded by the P+ type isolation region 36 and the P+ type buried layer 32 becomes a second element formation region in which can be formed a control circuit element having electrodes only on the surface 35.

Figure 3A:
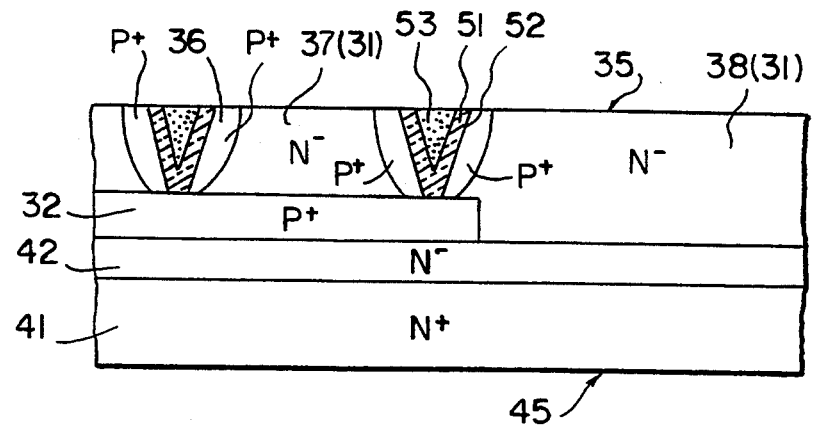
FIGS. 3a to 3b are sectional views illustrating additional steps to FIG. 2d of the present invention.
Figure 3B:
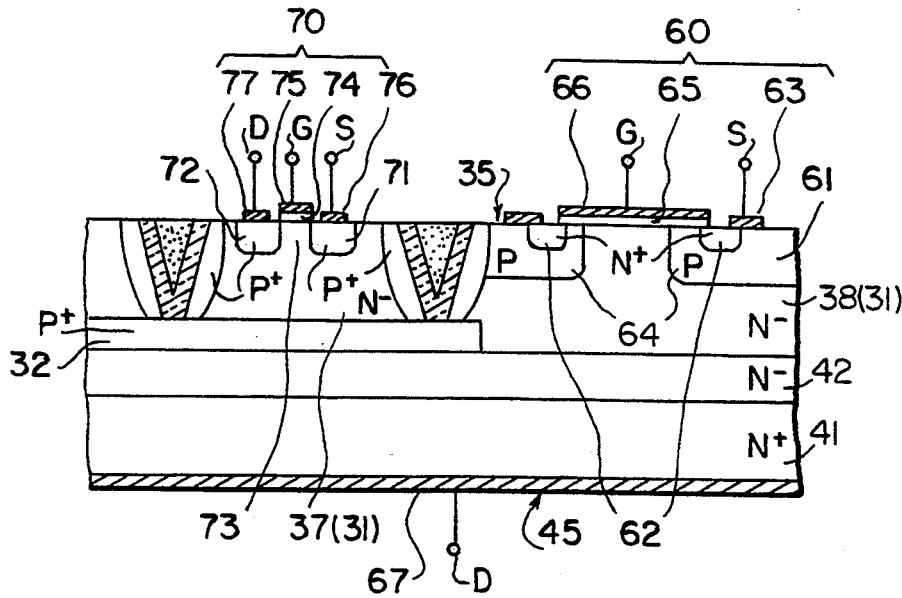

Referring to FIGS. 3a to 3b, an embodiment for manufacturing an integrated circuit using the laminated substrate for semiconductor device obtained in FIG. 2d will be described.

As shown in FIG. 3a, a V-shaped isolation groove 51 reaching the buried layer 32 is formed in the P+ type isolation region 36 by anisotropic wet etching, a silicon dioxide film 52 is formed on the surface of the groove, and the groove is filled by depositing polycrystalline silicon 53 on it. With such a structure, the isolation action becomes more certain than in the case of the P+ type isolation region alone.

Next, as shown in FIG. 3b, a P type region 61 is formed in ring form from the surface 35 of the portion 38 of the silicon substrate 31, a high concentration (low resistivity) N+ type source region 62 is formed in ring form in the region 61, a gate electrode 66,(G) is formed on a gate insulating film 65 formed on the region 62 and the portion 38 so as to make the ring like portion of the P type region on the inside of the source region 62 a channel region 64, a source electrode 63,(S) connected to the source region 62 and the P type region 61 is formed, and a drain electrode 67,(D) is formed on the surface 45 of the first silicon substrate 41, thereby constituting a power FET having a current path leading from the source electrode 63 on the surface 35 to the drain electrode 67 on the surface 45. On the other hand, in the N− type portion 37 isolated by a P-N junction there are formed, from the surface 35, high concentration P+ type source and drain region 71 and 72, a source electrode 76,(S) and a drain electrode 77,(D) connected to region 71 and 72, respectively, and a gate electrode 75,(G) formed via a gate insulating film 74 on the channel region 73, forming an FET as an element constituting a part of a control circuit.

Figure 4:
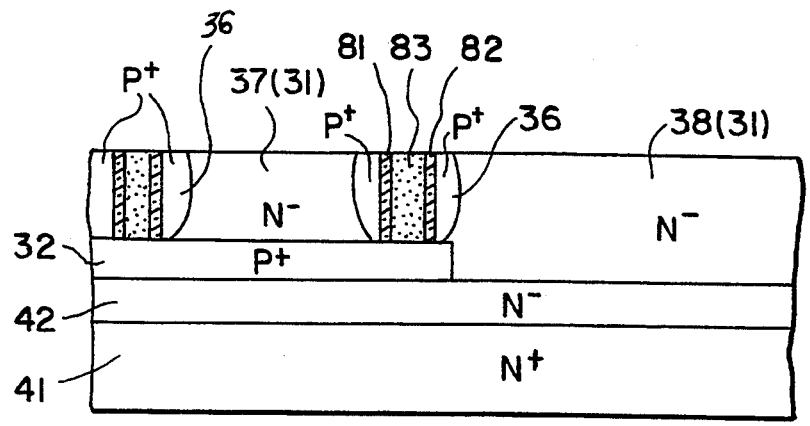
FIG. 4 is a sectional view illustrating another embodiment of the present invention.

FIG. 4 is a sectional view of a partial modification of the embodiment in FIGS. 3a to 3b. In the P+ type isolation region 36, a groove having vertical sidewalls 81 that reach the P+ type region 32 is formed by anisotropic dry etching, a silicon dioxide film 82 is formed on the sidewalls, and the groove is filled up by depositing polycrystalline silicon 83 on top of it. With such a structure, the isolating action is assured more than in the case of having only the P+ type isolation region 36 as in FIG. 3a.

In the above description of the embodiments, it has been assumed that the first and the second silicon substrates 41 and 31 and the epitaxial layer 42 are N (N+ or N−) type, and the isolating region 36 and the buried layer 32 are P (P+) type, but it is possible to interchange the N type and the P type, and let the first and the second silicon substrates and the epitaxial layer be P (P+ or P−) type, and let the isolating region and the buried layer be N (N+) type. In this case, the N type and the P type for the source and drain region, the channel regions, and the like are naturally to be interchanged.

As described in the above, single crystal silicon alone needs to be mirror polished in this invention, and it becomes possible to manufacture laminated substrates for semiconductor devices with high productivity, suitable for mass production. In addition, since a silicon dioxide film or a poly crystalline silicon film is not buried in the single crystal silicon substrate, there will not be generated problems such as a large warping of the substrate or a distortion of single crystal silicon in the element region which may be lead to generation of dislocations in the polishing process or heat treatment process. More specifically, an observation by an optical microscope of etch pit density in a lightly etched surface of the substrate manufactured according to this invention showed an improvement of $10^2$ pits/cm$^2$ in contrast to the pit density of about $10^4$ pits/cm$^2$ for the substrate manufactured according to the prior art technique. Moreover, it was confirmed that the warp of the substrate manufactured according to this invention was reduced to a value of less than 40 μm in contrast to the value of 50 to 100 μm for the substrate manufactured according to the prior art technique.

The invention has thus been shown and described with reference to the specific embodiments. However, it should be noted that the present invention is in no way limited to the details of the embodiments but changes and modification may be made within the scope of the appended claims.

What is claimed is:

1. A method for manufacturing a laminated substrate for a semiconductor device comprising the steps of:

(a) preparing a first semiconductor substrate of a first conductivity type and a second semiconductor substrate of the first conductivity type, said first semiconductor substrate having a first main surface and a second main surface opposite to said first main surface and said second semiconductor substrate having a third main surface and a fourth main surface opposite to said third main surface;

(b) forming a first region of a second conductivity type by selectively introducing impurities into said first main surface of said first semiconductor substrate;

(c) forming an epitaxial layer of the first conductivity type on said third main surface of said second semiconductor substrate;

(d) placing said first main surface of the first semiconductor substrate and a surface of said epitaxial layer in contact with each other and then heating said first and second semiconductor substrates to bond each other;

(e) polishing said second main surface of said first semiconductor substrate to produce a polished surface; and (f) forming an isolating region of the second conductivity type reaching said first region by introducing impurities into said first semiconductor substrate from said polished surface.

2. The method of claim 1, further comprising the steps of forming a groove reaching said buried layer in said isolating region, forming an insulating film on a surface of said groove, and forming polycrystalline silicon on a surface of said insulating film, said insulating film and said polycrystalline silicon cooperating to each other to fill said groove.

* * * * *